US011397275B2

(12) United States Patent
Lin et al.

(10) Patent No.: US 11,397,275 B2
(45) Date of Patent: Jul. 26, 2022

(54) DISTRIBUTED DEVICE AND METHOD FOR DETECTING GROUNDWATER BASED ON NUCLEAR MAGNETIC RESONANCE

(71) Applicant: JILIN UNIVERSITY, Changchun (CN)

(72) Inventors: Tingting Lin, Changchun (CN); Kun Zhou, Changchun (CN); Chao Chen, Changchun (CN); Pengfei Wang, Changchun (CN); Yang Zhang, Changchun (CN); Ling Wan, Changchun (CN)

(73) Assignee: JILIN UNIVERSITY, Jilin (CN)

( * ) Notice: Subject to any disclaimer, the term of this patent is extended or adjusted under 35 U.S.C. 154(b) by 0 days.

(21) Appl. No.: 17/192,920

(22) Filed: Mar. 5, 2021

(65) Prior Publication Data

US 2022/0003888 A1 Jan. 6, 2022

(30) Foreign Application Priority Data

Jul. 6, 2020 (CN) .......................... 202010639391.7

(51) Int. Cl.
*G01V 3/14* (2006.01)
*G01R 33/3415* (2006.01)
*G01R 33/36* (2006.01)

(52) U.S. Cl.
CPC ............ *G01V 3/14* (2013.01); *G01R 33/3415* (2013.01); *G01R 33/3621* (2013.01); *G01R 33/3678* (2013.01); *G01R 33/3692* (2013.01)

(58) Field of Classification Search
CPC .. G01V 3/14; G01R 33/3415; G01R 33/3621; G01R 33/3678; G01R 33/3692
See application file for complete search history.

(56) References Cited

U.S. PATENT DOCUMENTS

| 9,910,105 B2 * | 3/2018 | Boesch | G05D 1/101 |
| 2010/0161231 A1 * | 6/2010 | Atila | G01V 9/002 |
| | | | 702/15 |

(Continued)

FOREIGN PATENT DOCUMENTS

| CN | 103412341 A | 11/2013 |
| CN | 105353413 A | 2/2016 |

(Continued)

*Primary Examiner* — Dixomara Vargas
(74) *Attorney, Agent, or Firm* — Yue (Robert) Xu; Apex Attorneys at Law, LLP

(57) ABSTRACT

A distributed device and method for detecting groundwater based on nuclear magnetic resonance are provided. The device includes an excitation apparatus, multiple polarization apparatuses, an aerial reception apparatus, and a control apparatus. The aerial reception apparatus includes an array cooled coil sensor. For each of the multiple polarization apparatuses, a position analysis module determines, together with a second position analysis module of the polarization apparatus, a position of the array cooled coil sensor relative to a polarization coil in the polarization apparatus. A polarization transmitter in the polarization apparatus switches to a mode of waiting for output in a case that the array cooled coil sensor is in coverage of the polarization coil. The polarization transmitter in the polarization apparatus remains in a standby mode in a case that the array cooled coil sensor is beyond coverage of the polarization coil.

10 Claims, 6 Drawing Sheets

(56) References Cited

U.S. PATENT DOCUMENTS

| | | | |
|---|---|---|---|
| 2014/0035578 A1* | 2/2014 | Song | G01V 3/32 324/309 |
| 2015/0284811 A1* | 10/2015 | Knight | C12Q 1/6874 506/8 |
| 2017/0139078 A1* | 5/2017 | Knight | G06N 20/10 |
| 2017/0343695 A1* | 11/2017 | Stetson | G01V 3/101 |
| 2020/0110185 A1* | 4/2020 | Xu | G01V 1/181 |

FOREIGN PATENT DOCUMENTS

| | | |
|---|---|---|
| CN | 107942397 A | 4/2018 |
| CN | 109814161 A | 5/2019 |

\* cited by examiner

DISTRIBUTED DEVICE AND METHOD FOR DETECTING GROUNDWATER BASED ON NUCLEAR MAGNETIC RESONANCE

The present application claims priority to Chinese Patent Application No. 202010639391.7, titled "DISTRIBUTED DEVICE AND METHOD FOR DETECTING GROUNDWATER BASED ON NUCLEAR MAGNETIC RESONANCE", filed on Jul. 6, 2020 with the China National Intellectual Property Administration, which is incorporated herein by reference in its entirety.

FIELD

The present disclosure relates to the technical field of geophysical prospecting, and in particular to a device for detecting groundwater with an array cooled coil based on magnetic resonance multidimensional imaging and a method for detecting groundwater based on magnetic resonance multidimensional imaging.

BACKGROUND

With rapid economic development and population growth, there is a serious problem of water shortage in China. Since magnetic resonance sounding (MRS) technology is non-invasive, qualitative and quantitative, the magnetic resonance sounding technology is used for detecting groundwater and has been rapidly developed in recent years. However, the existing detection method based on magnetic resonance sounding are mostly performed under a geomagnetic field where a signal is weak. Therefore, it is difficult to acquire an effective magnetic resonance signal. In addition, efficiency is low when performing detection at multiple positions in a large range with the existing detection method. Therefore, it is necessary to explore and develop a device and a method for rapidly detecting groundwater based on multi-dimensional imaging.

Chinese patent application with the publication number of CN105353413A discloses an apparatus for detecting water. The apparatus for detecting water includes a main machine, a metal electrode and a non-polarized electrode. The main machine includes a receiver and transmitter. The transmitter is connected to the metal electrode. The receiver is connected to the non-polarized electrode. Both the metal electrode and the non-polarized electrode are connected to a detection region. The apparatus for detecting water can acquire data such as apparent resistivity, apparent polarizability, a half-life period, an attenuation degree, a synthetic induced polarization parameter and a deviation degree, so as to detect groundwater.

Chinese patent application with the publication number of CN103412341A discloses a device and a method for detecting groundwater with a cooled coil based on magnetic resonance sounding. The device includes a computer, a main control apparatus, a transmitter, a receiver, a cooled coil probe, and a transmission coil. The computer is connected to the transmission coil via the main control apparatus and the transmitter. The main control apparatus is connected to the cooled coil probe via the receiver. The receiver is connected to the computer. With this application, a Q value of the cooled coil and sensitivity of the probe are improved, which is of great significance for detecting groundwater and geological disasters in mines and tunnels.

Chinese patent application with the publication number of CN107942397A discloses a multi-channel magnetic resonance detection method and device using a pre-polarization field to enhance an amplitude of a signal. In the method, multiple direct current transmission coils, one direct current/alternate current transmission coil and multiple reception coils are arranged, to detect groundwater based on magnetic resonance sounding. With the method and the device, the amplitude of the signal is increased, a signal-to-noise ratio for detection is increased, so as to detect water under non-layered and high-noise condition such as tunnels and mines.

Chinese patent application with the publication number of CN109814161A discloses an aerial device and a method for detecting groundwater based on nuclear magnetic resonance. The aerial device includes an air system and a ground system. The air system includes an aerial vehicle, a main machine of the aerial device, an antenna tow cable, an aerial magnetic resonance detection transmission antenna and an aerial magnetic resonance signal reception antenna. The aerial vehicle carries the main machine, which is connected to the aerial magnetic resonance detection transmission antenna and the aerial magnetic resonance signal reception antenna via the antenna tow cable. In this application, a detection system is carried by the aerial vehicle that carries a small detection antenna, which is of great significance for rapidly detecting groundwater in a harsh surface environment.

With the above apparatus that detects groundwater by using polarized and non-polarized electrodes, electrodes are required in the detection region, resulting in complicated process and poor flexibility. Further, an increasing number of electrodes are arranged with an increment in an area of the detection region, which damages the ground surface thereby affecting the ecological environment. In the device for detecting groundwater with a cooled coil based on magnetic resonance sounding, the non-polarized electrode serves as a reception sensor, which improves performance of the sensor, so that the device can be operated in narrow spaces such as mines and tunnels flexibly. However, it is difficult to move the device in case of performing detection in a large range, resulting in low efficiency. With the multi-channel method magnetic resonance detection method using a pre-polarization field to enhance an amplitude, multi-dimensional imaging of high-noise underground space is realized. However, in this method, a coil combination and the number thereof is required to be set reasonably, resulting in complex wiring. In addition, it is difficult to arrange a reference coil in a small area, which affects the detection. With the aerial device for detecting groundwater based on nuclear magnetic resonance, both a transmission device and a reception device are carried by an aerial vehicle, which has a great advantage in detection efficiency. However, in a case that the aerial device for detecting groundwater operates in a geomagnetic field, a signal is weak, and it is difficult to acquire accurate information about groundwater.

SUMMARY

A distributed device for detecting groundwater based on nuclear magnetic resonance is provided according to the present disclosure. The device is applicable to detection of groundwater in case of large-scale, high-efficiency, and high-resolution, to reduce detection period and acquire an accurate detection result, which is of great significance to the detection of groundwater resources.

A distributed method for detecting groundwater based on nuclear magnetic resonance is provided according to the present disclosure.

The distributed device for detecting groundwater based on nuclear magnetic resonance includes an excitation apparatus, multiple polarization apparatuses, an aerial reception apparatus, and a control apparatus. The excitation apparatus is configured to generate an excitation magnetic field, to generate a magnetic resonance signal indicating groundwater. The multiple polarization apparatuses are configured to generate a polarization field to enhance an intensity of the magnetic resonance signal indicating groundwater. The aerial reception apparatus is configured to receive the magnetic resonance signal indicating groundwater. The control apparatus includes a main control-display module and a first wireless module. The main control-display module is configured to configure an operation state and a parameter for the distributed device, transmit the operation state and the parameter via the first wireless module, acquire the magnetic resonance signal received by the aerial reception apparatus via the first wireless module, and display the acquired magnetic resonance signal.

In an embodiment, the excitation apparatus includes an excitation transmitter, a second wireless module and an excitation coil. The excitation transmitter includes an excitation control module and an alternating current excitation module. The excitation control module is configured to communicate with the control apparatus via the second wireless module to control the alternating current excitation module to generate an excitation current flowing through the excitation coil. The second wireless module is connected to the excitation transmitter, and is configured to communicate with the control apparatus to control an output of the excitation transmitter to complete a detection task according to a set time series.

In an embodiment, each of the multiple polarization apparatuses includes a polarization transmitter, a wireless module and a polarization coil. The polarization transmitter includes a polarization control module, a polarization module, and a second position analysis module. The second position analysis module is configured to communicate with the control apparatus via the wireless module, to control the polarization control module to control an output of the polarization module, to generate a polarization current flowing through the polarization coil.

In an embodiment, the multiple polarization apparatuses have a same structure, and an increasing number of polarization apparatuses are arranged with an increment in an area of a detection region.

In an embodiment, the aerial reception apparatus includes an array cooled coil sensor, a drone, a multi-channel receiver, and a third wireless module. The array cooled coil sensor is suspended from the drone and is connected to the multi-channel receiver via a wire to acquire the magnetic resonance signal. The drone is configured to carry the array cooled coil sensor and the multi-channel receiver, and is configured to move according to a planned detection routine during detection. The multi-channel receiver includes a reception control module, a reception module, and a first position analysis module. The first position analysis module is configured to control the reception control module to control the reception module; and the multi-channel receiver is connected to the array cooled coil sensor to receive the magnetic resonance signal acquired by the array cooled coil sensor and store the received magnetic resonance signal. The third wireless module is connected to the multi-channel receiver to control the multi-channel receiver to receive the magnetic resonance signal, and is configured to transmit the received magnetic resonance signal to the control apparatus under the control of the control apparatus.

In an embodiment, the second position analysis module is configured to, for each of the multiple polarization apparatuses, determine, together with the second position analysis module of the polarization apparatus, a position of the array cooled coil sensor relative to a polarization coil in the polarization apparatus. A polarization transmitter in the polarization apparatus switches to a mode of waiting for output in a case that the array cooled coil sensor is in coverage of the polarization coil. The polarization transmitter in the polarization apparatus remains in a standby mode in a case that the array cooled coil sensor is beyond coverage of the polarization coil.

In an embodiment, the excitation transmitter generates an alternating current ranging from 1A to 400A and a duration of the alternating current ranges from 10 ms to 80 ms. The multiple polarization transmitters each generate a polarization current of 200A and a duration of the polarization current ranges from 4 s to 8 s. A reception period of the multi-channel receiver is 1000 ms.

In an embodiment, the array cooled coil sensor includes an upper cover, a lower casing, a differential coil array and a low temperature resistant amplifier array. The differential coil array and the low temperature resistant amplifier array are arranged in the lower casing. The differential coil array includes nine differential coils arranged in a slot in the lower casing of the array cooled coil sensor and configured to sense the magnetic resonance signal. The low temperature resistant amplifier array includes low-temperature resistant amplifiers respectively connected to the nine differential coils. The low-temperature resistant amplifiers are arranged in the slot in the lower casing of the array cooled coil sensor and configured to primarily amplify the magnetic resonance signal. The upper cover covers the lower casing after the lower casing is filled with liquid nitrogen for refrigeration.

In an embodiment, a distributed method for detecting groundwater based on nuclear magnetic resonance is provided. The method includes the following steps 1 to 10.

In step 1, an excitation apparatus and multiple polarization apparatuses are arranged in a detection region, and components in each apparatus are connected.

In step 2, an aerial reception apparatus is provided, and an array cooled coil sensor in the aerial reception apparatus is filled with liquid nitrogen for refrigeration.

In step 3, the excitation apparatus, the multiple polarization apparatuses and the aerial reception apparatus are all turned on. A parameter for an excitation transmitter in the excitation apparatus, parameters for polarization transmitters respectively in the multiple polarization apparatuses and a parameter for a multi-channel receiver in the aerial reception apparatus are set in a control apparatus. The aerial reception apparatus flies to a preset position.

In step 4, for each of the multiple polarization apparatuses, first position analysis module together with a second position analysis module of the polarization apparatus, determines a position of the array cooled coil sensor relative to a polarization coil in the polarization apparatus. A polarization transmitter in the polarization apparatus switches to a mode of waiting for output in a case that the array cooled coil sensor is in coverage of the polarization coil. The polarization transmitter in the polarization apparatus remains in a standby mode in a case that the array cooled coil sensor is beyond coverage of the polarization coil.

In step 5, the polarization transmitter switching to the mode of waiting for output generates a polarization current flowing through the polarization coil to polarize groundwater to enhance a magnetic resonance signal indicating groundwater.

In step 6, when polarization is finished, the polarization transmitter is turned off quickly and smoothly. The excitation transmitter outputs an alternating current with a local Larmor frequency. The alternating current flows through an excitation coil in the excitation apparatus to excite groundwater.

In step 7, when excitation is finished, the aerial reception apparatus carrying the array cooled coil sensor receives the magnetic resonance signal.

In step 8, the received magnetic resonance signal is transmitted to a handheld terminal to display a detection result.

In step 9, another excitation current is generated based on the set parameter for the excitation transmitter, to detect groundwater under ground of different depths.

In step 10, steps 4 to 9 are repeated, to acquire original data for the entire detection region. Data processing such as noise reduction and inversion is performed on the original data to acquire a result of distribution of groundwater.

In step 4, the polarization transmitter generates the polarization current only in a case that the array cooled coil sensor is in coverage of the polarization coil corresponding to the polarization transmitter. In other cases, the polarization transmitter is in the standby mode.

The position analysis module determines the position as follows. The position analysis module, for each of the multiple polarization apparatuses, together with a second position analysis module of the polarization apparatus, determines a position of the array cooled coil sensor relative to a polarization coil in the polarization apparatus. A polarization transmitter in the polarization apparatus switches to a mode of waiting for output in a case that the array cooled coil sensor is in coverage of the polarization coil. The polarization transmitter in the polarization apparatus remains in a standby mode in a case that the array cooled coil sensor is beyond coverage of the polarization coil.

Compared with the conventional technology, the present disclosure has the following advantageous effects.

1. A distributed device and method for detecting groundwater based on nuclear magnetic resonance are provided. The magnetic resonance signal is transmitted from ground and is received by the aerial reception apparatus. Therefore, it is unnecessary to frequently arrange coils when changing detection positions. The distributed device and method are applicable to detection of groundwater in case of large-scale, having advantages of fast detection speed and non-intrusive detection.

2. For each of the multiple polarization apparatuses, whether a polarization transmitter in the polarization apparatus outputs a polarization current is determined based a determination result of the position analysis module. The magnetic resonance signal indicating groundwater is enhanced by the polarization field. Further, resource waste caused by a polarization transmitter beyond an operation region outputting a polarization current is avoided, thereby greatly reducing power loss. The distributed device and method has advantages of convenience, safe and environmental protection.

3. In the array cooled coil sensor according to the present disclosure, an internal resistance of a reception coil is reduced by cooling. With the differential coil, common mode noise of the sensor is reduced. Differential coils are arranged in an array, so that multi-dimensional imaging capability of the sensor is improved. Therefore, the array cooled coil sensor is applicable to detection of groundwater under non-layered condition.

4. With the wireless control solution, the magnetic resonance signal is transmitted to the handheld terminal via the wireless module, thereby saving wiring resources and reducing time period for wiring. Further, accuracy of control and efficiency of signal transmission are ensured. Therefore, the distributed device and method have advantages of fast speed and high efficiency.

The distributed device and method for detecting groundwater based on nuclear magnetic resonance according to the present disclosure have advantages of wide adaptability, strong anti-interference, accurate detection result, fast detection speed, safety and environmental protection, so that a limitation in application the conventional method for detecting groundwater based on nuclear magnetic resonance. The technical solutions of the present disclosure may lay an important foundation for improving detection of groundwater in China, and have good promotion prospect and promotion value.

| | | |
|---|---|---|
| 1 excitation transmitter; | 2 second wireless module; | 3 excitation coil; |
| 4 first polarization coil; | 5 first polarization transmitter; | |
| 6 fourth wireless module; | 7 second polarization coil; | |
| 8 second polarization transmitter; | 9 fifth wireless module; | |
| 10 third polarization coil; | 11 third polarization transmitter; | |
| 12 sixth wireless module; | 13 fourth polarization coil; | |
| 14 fourth polarization transmitter; | 15 seventh wireless module; | |
| 16 array cooled coil sensor; | | |
| 16-1 upper cover of the array cooled coil sensor; | | |
| 16-2 lower casing of the array cooled coil sensor; | | |
| 17 wire; | 18 multi-channel receiver; | 19 third wireless module; |
| 20 connection line; | 21 drone; | |
| 22 first wireless module; | 23 main control-display module; | |
| 24 excitation control module; | 25 alternating current excitation module; | |
| 26 first position analysis module; | 27 reception control module; | |
| 28 reception module; | 29 polarization control module I; | |

| | |
|---|---|
| 30 polarization module I; | 31 second position analysis module; |
| 32 polarization control module II; | 33 polarization module II; |
| 34 second position analysis module; | 35 differential coil array; |
| 36 low temperature resistant amplifier array; | 37 transmission cache; |
| 38 signal collected by receiver; | 39 memory. |

DETAILED DESCRIPTION

In order to make objects, technical solutions and advantages of the present disclosure clearer, the present disclosure is described in detail below in conjunction with embodiments. It should be understood that specific embodiments described herein are only for explaining the present disclosure rather than limiting the present disclosure.

Figure 1:
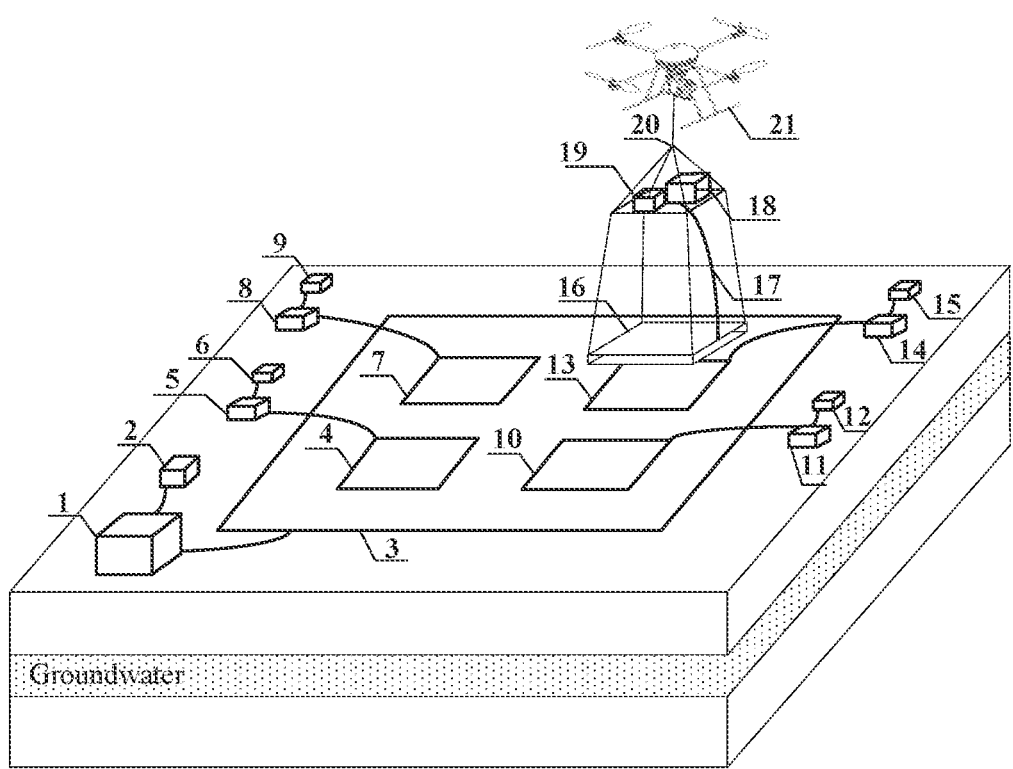
FIG. 1 schematically shows a layout of a distributed device for detecting groundwater based on nuclear magnetic resonance in a field.
Figure 2:
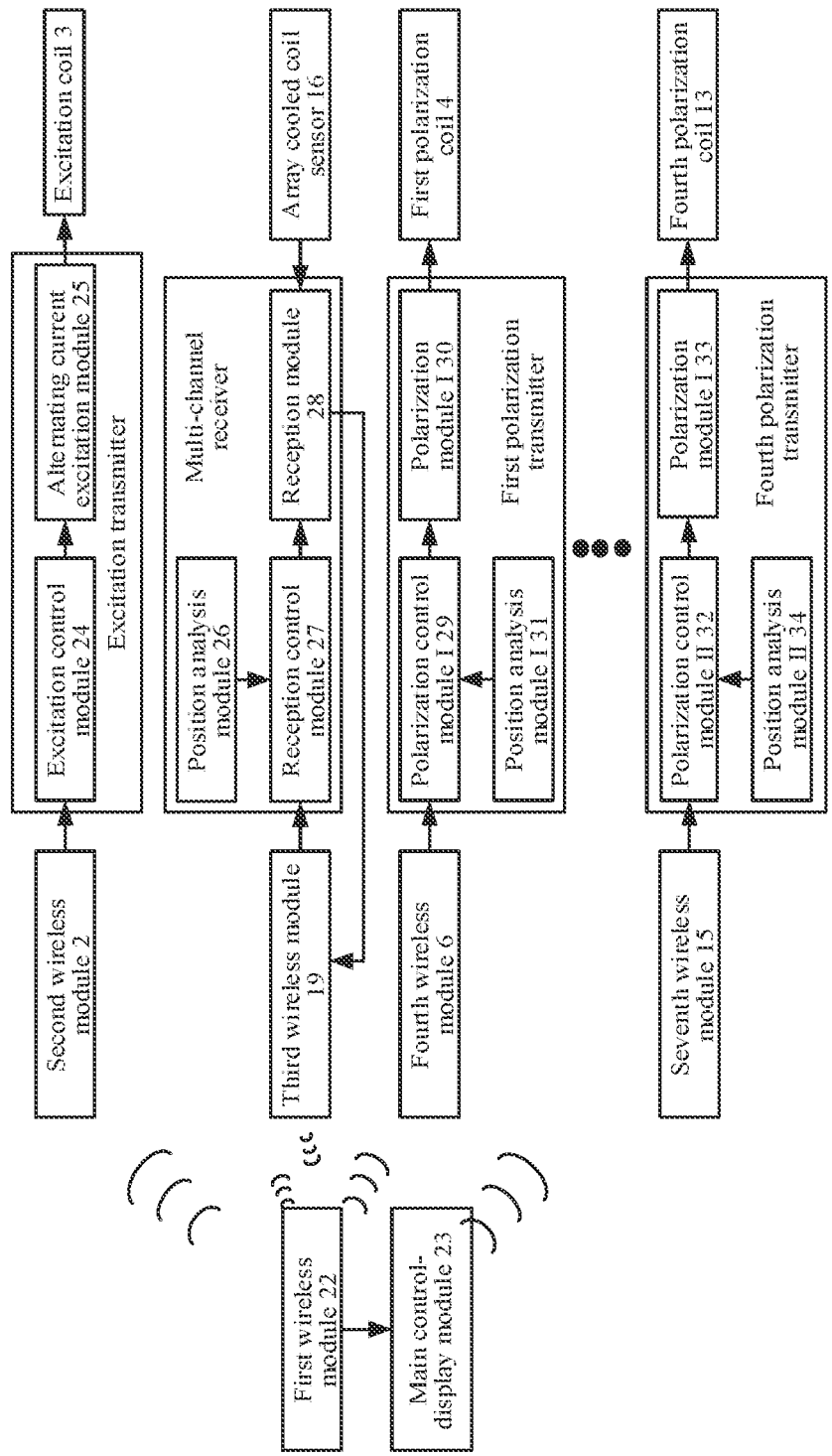
FIG. 2 is a structural block diagram of a distributed device for detecting groundwater based on nuclear magnetic resonance.

As shown in FIGS. 1 and 2, a distributed device for detecting groundwater based on nuclear magnetic resonance includes an excitation apparatus, multiple polarization apparatuses, an aerial reception apparatus, and a control apparatus. In the excitation apparatus, a second wireless module 2 controls an excitation transmitter 1 to output an excitation current flowing through an excitation coil 3. An increasing number of polarization apparatuses may be arranged with an increment in an area of the detection region. In an embodiment, the distributed device includes four polarization apparatuses that are distributed in a detection region, and four polarization coils respectively in the four polarization apparatuses are distributed in an array in coverage of the excitation coil 3.

The excitation apparatus is configured to generate an excitation magnetic field, to generate a magnetic resonance signal indicating groundwater.

The multiple polarization apparatuses are configured to generate a polarization field to enhance an intensity of the magnetic resonance signal indicating groundwater.

The aerial reception apparatus is configured to receive the magnetic resonance signal indicating groundwater.

The control apparatus includes a main control-display module and a first wireless module.

The main control-display module is configured to configure an operation state and a parameter for the distributed device, transmit the operation state and the parameter via the first wireless module, acquire the magnetic resonance signal received by the aerial reception apparatus via the first wireless module, and display the acquired magnetic resonance signal.

The excitation apparatus includes the excitation transmitter 1, the second wireless module 2 and the excitation coil 3.

The excitation transmitter includes an excitation control module 24 and an alternating current excitation module 25. The excitation control module is configured to communicate with the control apparatus via the second wireless module to control the alternating current excitation module to generate an excitation current flowing through the excitation coil.

The second wireless module is connected to the excitation transmitter, and is configured to communicate with the control apparatus to control an output of the excitation transmitter to complete a detection task according to a set time series.

Each of the multiple polarization apparatuses includes a polarization transmitter, a wireless module and a polarization coil.

The polarization transmitter includes a polarization control module, a polarization module, and a second position analysis module. The second position analysis module is configured to communicate with the control apparatus via the wireless module, to control the polarization control module to control an output of the polarization module, to generate a polarization current flowing through the polarization coil.

An increasing number of polarization apparatuses are arranged with an increment in an area of a detection region.

In this embodiment, the distributed device includes four polarization apparatuses. That is, there are four polarization coils, namely, a first polarization coil 4, a second polarization coil 7, a third polarization coil 10 and a fourth polarization coil 13. The control apparatus controls a first polarization transmitter 5 via a fourth wireless module 6 to generate a polarization current flowing through the first polarization coil 4. The control apparatus controls a second polarization transmitter 8 via a fifth wireless module 9 to generate a polarization current flowing through the second polarization coil 7. The control apparatus controls a third polarization transmitter 11 via a sixth wireless module 12 to generate a polarization current flowing through the third polarization coil 10. The control apparatus controls a fourth polarization transmitter 14 via a seventh wireless module 15 to generate a polarization current flowing through the fourth polarization coil 13.

In the aerial reception apparatus, an array cooled coil sensor 16 and a multi-channel receiver 18 are suspended from a drone via a connection line 20. A third wireless module 19 is connected to the multi-channel receiver 18. The array cooled coil sensor 16 is electrically connected to the multi-channel receiver 18 via a wire 17. The aerial reception apparatus includes an array cooled coil sensor, a drone, a multi-channel receiver, and a third wireless module.

The array cooled coil sensor is suspended from the drone and is connected to the multi-channel receiver via a wire to acquire the magnetic resonance signal.

The drone is configured to carry the array cooled coil sensor and the multi-channel receiver, and is configured to move according to a planned detection routine during detection.

The multi-channel receiver includes a reception control module, a reception module, and a first position analysis module. The first position analysis module is configured to control the reception control module to control the reception module; and the multi-channel receiver is connected to the array cooled coil sensor to receive the magnetic resonance signal acquired by the array cooled coil sensor and store the received magnetic resonance signal.

The third wireless module is connected to the multi-channel receiver to control the multi-channel receiver to receive the magnetic resonance signal, and is configured to transmit the received magnetic resonance signal to the control apparatus under the control of the control apparatus.

Referring to FIG. 2, communications in the distributed device for detecting groundwater based on nuclear magnetic resonance are as follows. The first wireless module 22 is connected to the main control-display module 23. The first wireless module 22 may transmit data to the second wireless module 2, the third wireless module 19, the fourth wireless module 6, the fifth wireless module 9, the sixth wireless module 12, and the seventh wireless module 15. The third wireless module 19 may transmit data to the first wireless module 22, so as to transmit the magnetic resonance signal to the main control-display module. In the excitation transmitter 1, the excitation control module 24 controls an output of the alternating current excitation module 25. In the multi-channel receiver 18, a first position analysis module 26 controls the reception control module 27 to control the reception module 28. In the first polarization transmitter 5, a second position analysis module 31 controls the polarization control module 129 to control an output of the polarization module 130. In the fourth polarization transmitter 14, a second position analysis module 34 control the polarization control module 1132 to control an output of the polarization module II 33.

The excitation transmitter generates an alternating current ranging from 1A to 400A and a duration of the alternating current ranges from 10 ms to 80 ms. The multiple polarization transmitters each generate a polarization current of 200A and a duration of the polarization current ranges from 4 s to 8 s. A reception period of the multi-channel receiver is 1000 ms.

Figure 3:
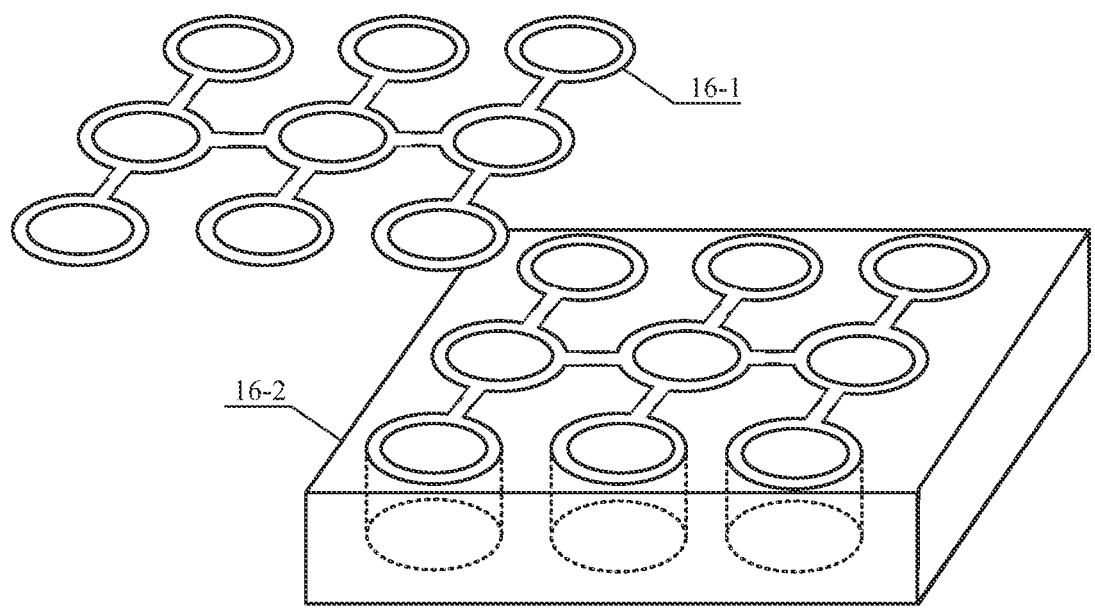
FIG. 3 shows a structure of an array cooled coil sensor.

FIG. 3 shows a structure of an array cooled coil sensor. The array cooled coil sensor includes an upper cover 16-1 and a lower casing 16-2. The upper cover 16-1 fits into a slot of the lower casing 16-2, so that a closed space is formed in the array cooled coil sensor after being filled with liquid nitrogen, so as to achieve refrigeration.

Figure 4:
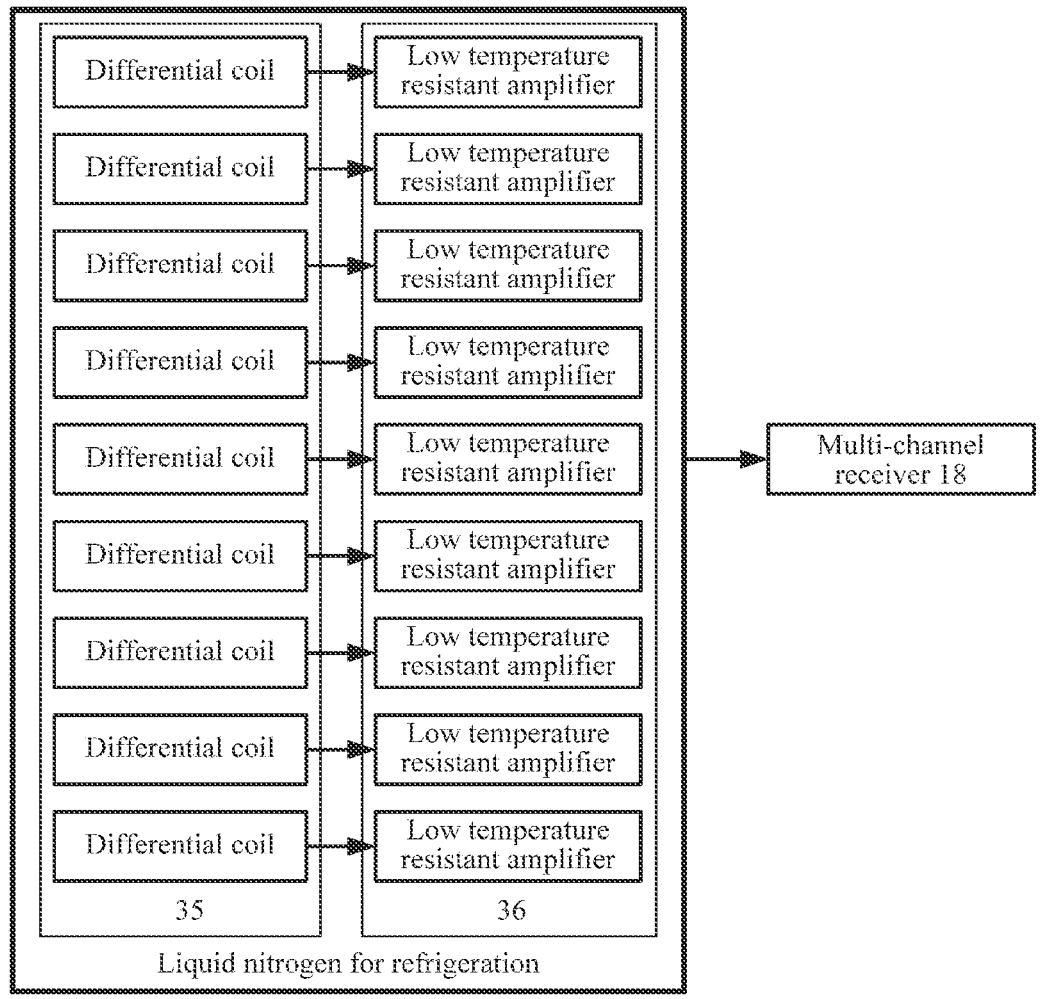
FIG. 4 shows a circuit structure of the array cooled coil sensor.

FIG. 4 shows a circuit structure of the array cooled coil sensor. The array cooled coil sensor includes a differential coil array 35 and a low temperature resistant amplifier array 36. The differential coil array 35 includes nine differential coils. Each of the nine differential coils is connected to a low-temperature resistant amplifier. The array cooled coil sensor 16 connected to the multi-channel receiver 18. These differential coils and low-temperature resistant amplifiers respectively connected to these differential coils are arranged in a slot in the lower casing of the array cooled coil sensor. The array cooled coil sensor is sealed after being filled with liquid nitrogen.

Figure 5:
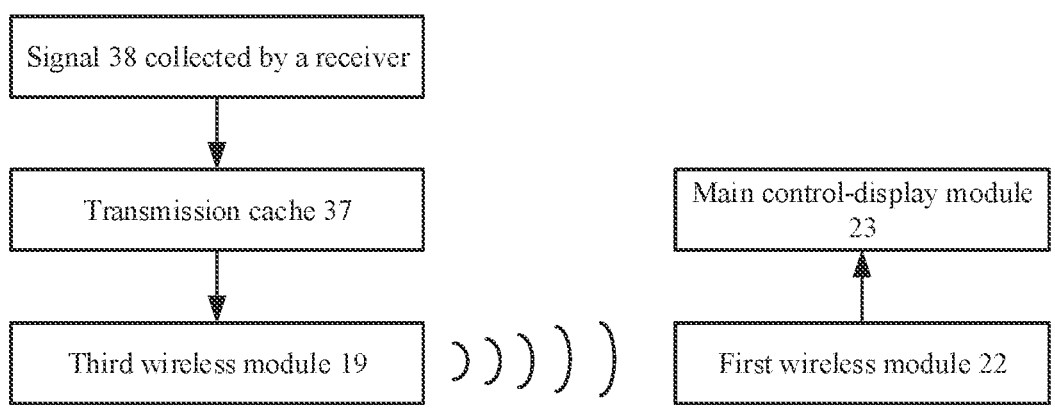
FIG. 5 schematically shows transmission of magnetic resonance signal data to a handheld terminal.

FIG. 5 schematically shows transmission of magnetic resonance signal data to a handheld terminal. In a transmission portion, a signal 38 received by the receiver is transmitted to a transmission cache 37, and then is transmitted via the third wireless module 19. In a reception portion, the first wireless module 22 receives the signal transmitted by the third wireless module 19, and then transmits the signal to a main control-display module 23, thereby monitoring a detection result in real time.

Figure 6:
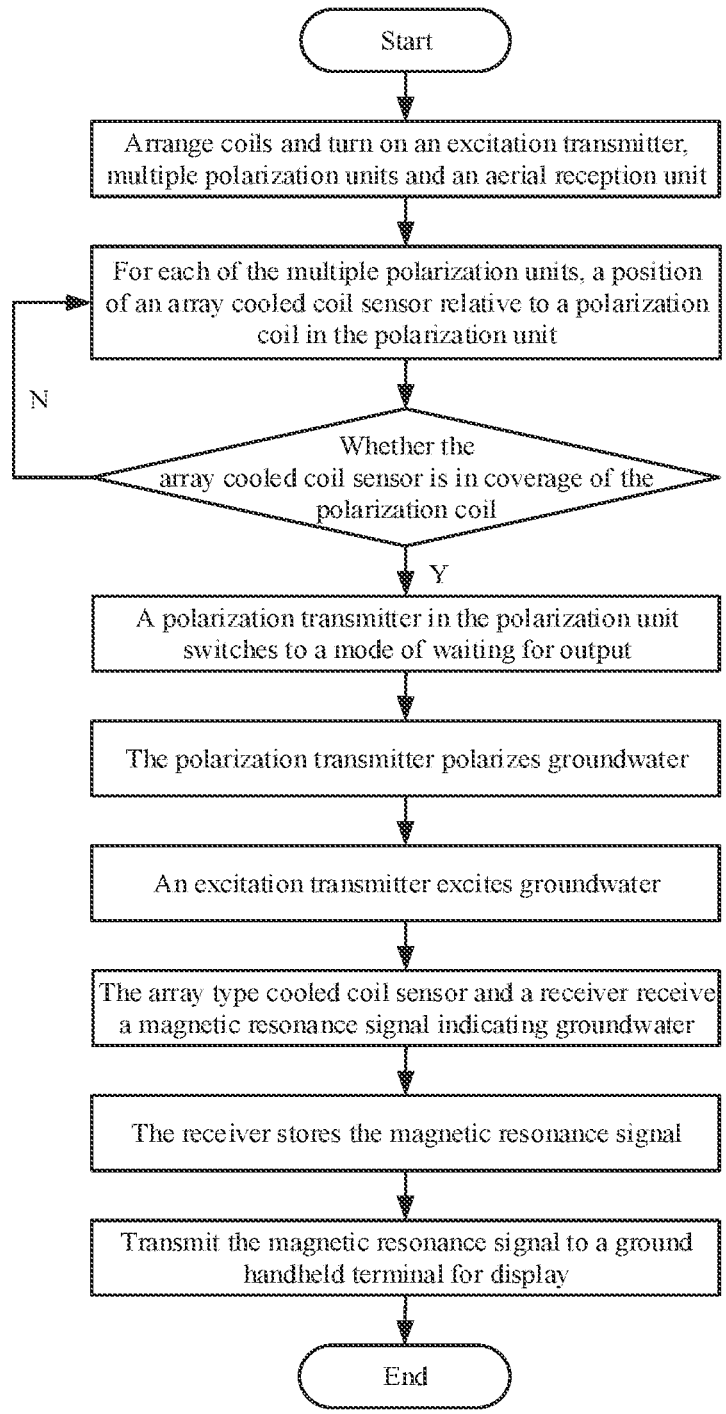
FIG. 6 is a flowchart of a distributed method for detecting groundwater based on nuclear magnetic resonance.

FIG. 6 is a flowchart of a distributed method for detecting groundwater based on nuclear magnetic resonance. Coils are arranged. Distributed apparatuses are turned on. An excitation transmitter excites the groundwater. It is determined, for each of polarization apparatuses, a position of an array cooled coil sensor relative to a polarization coil in the polarization apparatus. It is determined whether the array cooled coil sensor is in coverage of the polarization coil. A polarization transmitter in the polarization apparatus polarizes groundwater in a case that the array cooled coil sensor is in coverage of the polarization coil. The polarization transmitter in the polarization apparatus remains in a standby mode in a case that the array cooled coil sensor is beyond coverage of the polarization coil. An array cooled coil sensor and a receiver receive a magnetic resonance signal indicating groundwater. The magnetic resonance signal is stored in the receiver and is transmitted to a ground handheld terminal.

The distributed method for detecting groundwater based on nuclear magnetic resonance includes the following steps 1 to 10.

In step 1, an excitation apparatus and multiple polarization apparatuses are arranged in a detection region, and components in each apparatus are connected.

In step 2, an aerial reception apparatus is provided, and an array cooled coil sensor in the aerial reception apparatus is filled with liquid nitrogen for refrigeration.

In step 3, the excitation apparatus, the multiple polarization apparatuses and the aerial reception apparatus are all turned on. A parameter for an excitation transmitter in the excitation apparatus, parameters for polarization transmitters respectively in the multiple polarization apparatuses and a parameter for a multi-channel receiver in the aerial reception apparatus are set in a control apparatus. The aerial reception apparatus flies to a preset position.

In step 4, for each of the multiple polarization apparatuses, a position analysis module together with a second position analysis module of the polarization apparatus, determines a position of the array cooled coil sensor relative to a polarization coil in the polarization apparatus. A polarization transmitter in the polarization apparatus switches to a mode of waiting for output in a case that the array cooled coil sensor is in coverage of the polarization coil. The polarization transmitter in the polarization apparatus remains in a standby mode in a case that the array cooled coil sensor is beyond coverage of the polarization coil.

In step 5, the polarization transmitter switching to the mode of waiting for output generates a polarization current flowing through the polarization coil to polarize groundwater to enhance a magnetic resonance signal indicating groundwater.

In step 6, when polarization is finished, the polarization transmitter is turned off quickly and smoothly. The excitation transmitter outputs an alternating current with a local Larmor frequency. The alternating current flows through an excitation coil in the excitation apparatus to excite groundwater.

In step 7, when excitation is finished, the aerial reception apparatus carrying the array cooled coil sensor receives the magnetic resonance signal.

In step 8, the received magnetic resonance signal is transmitted to a handheld terminal to display a detection result.

In step 9, another excitation current is generated based on the set parameter for the excitation transmitter, to detect groundwater under ground of different depths.

In step 10, steps 4 to 9 are repeated, to acquire original data for the entire detection region. Data processing such as noise reduction and inversion is performed on the original data to acquire a result of distribution of groundwater.

In step 4, the polarization transmitter generates the polarization current only in a case that the array cooled coil sensor is in coverage of the polarization coil corresponding to the polarization transmitter. In other cases, the polarization transmitter is in the standby mode.

The position analysis module determines the position as follows. The position analysis module determines, for each of the multiple polarization apparatuses, a position of the array cooled coil sensor relative to a polarization coil in the polarization apparatus. A polarization transmitter in the polarization apparatus switches to a mode of waiting for output in a case that the array cooled coil sensor is in coverage of the polarization coil. The polarization transmitter in the polarization apparatus remains in a standby mode in a case that the array cooled coil sensor is beyond coverage of the polarization coil.

With the distributed device and method for detecting groundwater based on nuclear magnetic resonance are provided according to the present disclosure, arrangement of coils is reduced to a certain extent, and detection efficiency is improved. With the multiple polarization apparatuses with position analysis modules, the magnetic resonance signal indicating groundwater is enhanced while avoiding waste of electrical resources, having advantages of safety and environmental protection. With the aerial reception apparatus having a drone, the magnetic resonance signal can be acquired rapidly, thereby adapting to various conditions and improving detection efficiency. With the array cooled coil sensor, imaging of groundwater under non-layered condition is accurate, having advantages of strong anti-interference, accurate detection result and multi-dimensional imaging.

Preferred embodiments of the present disclosure are described above, and are not intended to limit the present disclosure. All modifications, equivalent replacements and improvements made within the spirit and principle of the present disclosure shall be included in the protection scope of the present disclosure.

The invention claimed is:

1. A distributed device for detecting groundwater based on nuclear magnetic resonance, comprising:
   an excitation apparatus configured to generate an excitation magnetic field, to generate a magnetic resonance signal indicating groundwater;
   a plurality of polarization apparatuses configured to generate a polarization field to enhance an intensity of the magnetic resonance signal indicating groundwater;
   an aerial reception apparatus configured to receive the magnetic resonance signal indicating groundwater; and
   a control apparatus comprising a first wireless module and a main control-display module, wherein the main control-display module is configured to configure an operation state and a parameter for the distributed device, transmit the operation state and the parameter via the first wireless module, acquire the magnetic resonance signal received by the aerial reception apparatus via the first wireless module, and display the acquired magnetic resonance signal.

2. The distributed device for detecting groundwater based on nuclear magnetic resonance according to claim 1, wherein the excitation apparatus comprises:
   an excitation transmitter comprising an excitation control module and an alternating current excitation module;
   a second wireless module; and
   an excitation coil, wherein
   the excitation control module is configured to communicate with the control apparatus via the second wireless module to control the alternating current excitation module to generate an excitation current flowing through the excitation coil; and
   the second wireless module is connected to the excitation transmitter, and is configured to communicate with the control apparatus to control an output of the excitation transmitter to complete a detection task according to a set time series.

3. The distributed device for detecting groundwater based on nuclear magnetic resonance according to claim 1, wherein each of the plurality of polarization apparatuses comprises:

a polarization transmitter comprising a polarization control module, a polarization module, and a second position analysis module;
a wireless module; and
a polarization coil, wherein the second position analysis module is configured to communicate with the control apparatus via the wireless module, to control the polarization control module to control an output of the polarization module, to generate a polarization current flowing through the polarization coil.

4. The distributed device for detecting groundwater based on nuclear magnetic resonance according to claim 1, wherein the plurality of polarization apparatuses have a same structure, and an increasing number of polarization apparatuses are arranged with an increment in an area of a detection region.

5. The distributed device for detecting groundwater based on nuclear magnetic resonance according to claim 3, wherein the aerial reception apparatus comprises an array cooled coil sensor, a drone, a multi-channel receiver and a third wireless module, wherein
   the array cooled coil sensor is suspended from the drone and is connected to the multi-channel receiver via a wire to acquire the magnetic resonance signal;
   the drone is configured to carry the array cooled coil sensor and the multi-channel receiver, and is configured to move according to a planned detection routine during detection;
   the multi-channel receiver comprises a reception control module, a reception module, and a first position analysis module, wherein the first position analysis module is configured to control the reception control module to control the reception module, and the multi-channel receiver is connected to the array cooled coil sensor to receive the magnetic resonance signal acquired by the array cooled coil sensor and store the received magnetic resonance signal; and
   the third wireless module is connected to the multi-channel receiver to control the multi-channel receiver to receive the magnetic resonance signal, and is configured to transmit the received magnetic resonance signal to the control apparatus under the control of the control apparatus.

6. The distributed device for detecting groundwater based on nuclear magnetic resonance according to claim 5, wherein the first position analysis module is configured to, for each of the plurality of polarization apparatuses, determine, together with the second position analysis module of the polarization apparatus, a position of the array cooled coil sensor relative to a polarization coil in the polarization apparatus, wherein a polarization transmitter in the polarization apparatus switches to a mode of waiting for output in a case that the array cooled coil sensor is in coverage of the polarization coil, and the polarization transmitter in the polarization apparatus remains in a standby mode in a case that the array cooled coil sensor is beyond coverage of the polarization coil.

7. The distributed device for detecting groundwater based on nuclear magnetic resonance according to claim 1, wherein
   the excitation transmitter generates an alternating current ranging from 1A to 400A and a duration of the alternating current ranges from 10 ms to 80 ms;
   the plurality of polarization transmitters each generate a polarization current of 200A and a duration of the polarization current ranges from 4 s to 8 s; and a reception period of the multi-channel receiver is 1000 ms.

8. The distributed device for detecting groundwater based on nuclear magnetic resonance according to claim 1, wherein the array cooled coil sensor comprises an upper cover, a lower casing, a differential coil array and a low temperature resistant amplifier array, wherein the differential coil array and the low temperature resistant amplifier array are arranged in the lower casing;

the differential coil array comprises nine differential coils arranged in a slot in the lower casing of the array cooled coil sensor and configured to sense the magnetic resonance signal;

the low temperature resistant amplifier array comprises low-temperature resistant amplifiers respectively connected to the nine differential coils, wherein the low-temperature resistant amplifiers are arranged in the slot in the lower casing of the array cooled coil sensor and are configured to primarily amplify the magnetic resonance signal; and the upper cover is configured to cover the lower casing after the lower casing is filled with liquid nitrogen for refrigeration.

9. A distributed method for detecting groundwater based on nuclear magnetic resonance, comprising:

a step 1, arranging an excitation apparatus and a plurality of polarization apparatuses in a detection region, and connecting components in each apparatus;

a step 2, providing an aerial reception apparatus, and filling an array cooled coil sensor in the aerial reception apparatus with liquid nitrogen for refrigeration;

a step 3, turning on the excitation apparatus, the plurality of polarization apparatuses and the aerial reception apparatus; setting, in a control apparatus, a parameter for an excitation transmitter in the excitation apparatus, parameters for polarization transmitters respectively in the plurality of polarization apparatuses and a parameter for a multi-channel receiver in the aerial reception apparatus; and controlling the aerial reception apparatus to fly to a preset position;

a step 4, for each of the plurality of polarization apparatuses, determining, by a first position analysis module together with a second position analysis module of the polarization apparatus, a position of the array cooled coil sensor relative to a polarization coil in the polarization apparatus, wherein a polarization transmitter in the polarization apparatus switches to a mode of waiting for output in a case that the array cooled coil sensor is in coverage of the polarization coil, and a polarization transmitter in the polarization apparatus remains in a standby mode in a case that the array cooled coil sensor is beyond coverage of the polarization coil;

a step 5, generating, by the polarization transmitter switching to the mode of waiting for output, a polarization current flowing through the polarization coil to polarize groundwater to enhance a magnetic resonance signal indicating groundwater;

a step 6, when polarization is finished, turning off the polarization transmitter; outputting, by the excitation transmitter, an alternating current with a local Larmor frequency flowing through an excitation coil in the excitation apparatus to excite groundwater;

a step 7, when excitation is finished, receiving, by the aerial reception apparatus carrying the array cooled coil sensor, the magnetic resonance signal;

a step 8, transmitting the received magnetic resonance signal to a handheld Mal to display a detection result;

a step 9, generating another excitation current based on the set parameter for the excitation transmitter, to detect groundwater under ground of different depths; and a step 10, repeating steps 4 to 9 to acquire original data for the entire detection region, and performing data processing comprising noise reduction and inversion on the original data to acquire a result of distribution of groundwater.

10. The distributed method for detecting groundwater based on nuclear magnetic resonance according to claim 9, wherein the polarization transmitter generates the polarization current only in a case that the array cooled coil sensor is in coverage of the polarization coil corresponding to the polarization transmitter, and the polarization transmitter is in the standby mode in other cases; and for each of the plurality of polarization apparatuses, the determining, by a first position analysis module together with a second position analysis module of the polarization apparatus, a position of the array cooled coil sensor relative to a polarization coil in the polarization apparatus comprises:

determining a position of the array cooled coil sensor relative to the polarization coil in the polarization apparatus;

switching the polarization transmitter in the polarization apparatus to the mode of waiting for output in the case that the array cooled coil sensor is in coverage of the polarization coil; and controlling the polarization transmitter in the polarization apparatus to be in the standby mode in the case that the array cooled coil sensor is beyond coverage of the polarization coil.

* * * * *